US012562344B2

(12) United States Patent
Hidaka et al.

(10) Patent No.: US 12,562,344 B2
(45) Date of Patent: Feb. 24, 2026

(54) PLASMA PROCESSING APPARATUS

(71) Applicant: Tokyo Electron Limited, Tokyo (JP)

(72) Inventors: Koki Hidaka, Miyagi (JP); Koichi Kazama, Miyagi (JP); Takanori Sato, Miyagi (JP); Miyu Shihommatsu, Miyagi (JP); Takehiro Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1 day.

(21) Appl. No.: 18/429,515

(22) Filed: Feb. 1, 2024

(65) Prior Publication Data

US 2024/0177973 A1      May 30, 2024

Related U.S. Application Data

(63) Continuation of application No. PCT/JP2022/026802, filed on Jul. 6, 2022.

(30) Foreign Application Priority Data

Aug. 4, 2021    (JP) ................................. 2021-128076

(51) Int. Cl.
H01J 37/32 (2006.01)
(52) U.S. Cl.
CPC .... H01J 37/3244 (2013.01); H01J 37/32669 (2013.01); H01J 37/32091 (2013.01); *H01J 2237/038* (2013.01)
(58) Field of Classification Search
CPC . H01L 21/3065; H05H 1/46; H01J 37/32449; H01J 37/32091; H01J 37/32669; H01J 2237/038
See application file for complete search history.

(56) References Cited

U.S. PATENT DOCUMENTS

2022/0285135 A1* 9/2022 Oh ...................... H01J 37/3244
2022/0415618 A1* 12/2022 Kawanabe ........ H01J 37/32449

FOREIGN PATENT DOCUMENTS

| JP | 2021-044535 A | 3/2021 |
| KR | 20140117290 A | 10/2014 |
| KR | 20160016652 A | 2/2016 |
| KR | 20200131432 A | 11/2020 |

OTHER PUBLICATIONS

International Search Report and Written Opinion mailed on Aug. 23, 2022, received for PCT Application PCT/JP2022/026802, filed on Jul. 6, 2022, 8 pages including English Translation.

* cited by examiner

*Primary Examiner* — Patrick C Chen
(74) *Attorney, Agent, or Firm* — XSENSUS LLP

(57) ABSTRACT

A plasma processing apparatus includes a plasma processing chamber; a substrate support; a lower electrode; an RF power supply; and an upper electrode assembly. The upper electrode assembly includes a gas diffusion plate; an insulating plate; and an upper electrode plate arranged between the gas diffusion plate and the insulating plate, and having a plurality of first through holes and a plurality of second through holes. The insulating plate includes an inner annular protrusion and an outer annular protrusion protruding downward from a lower surface of the insulating plate, and the insulating plate has a plurality of first gas introduction holes, a plurality of second gas introduction holes, and a plurality of third gas introduction holes.

16 Claims, 7 Drawing Sheets

FIG. 3B
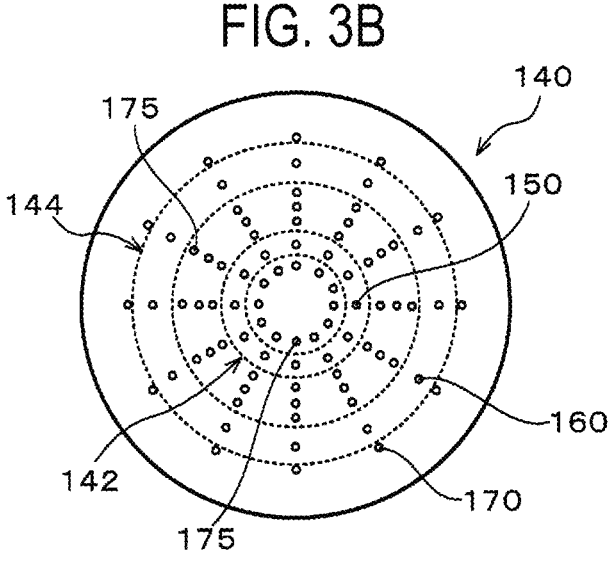
FIG. 4
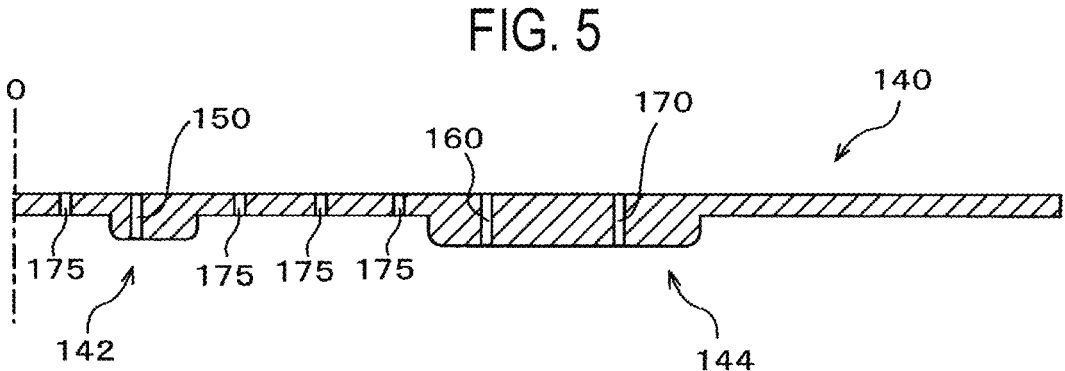
FIG. 5

PLASMA PROCESSING APPARATUS

CROSS-REFERENCE TO RELATED APPLICATIONS

This application is a bypass continuation application of International Patent Application No. PCT/JP2022/026802 having an international filing date of Jul. 6, 2022 and designating the United States, the International Patent Application being based upon and claiming the benefit of priority from Japanese Patent Application No. 2021-128076, filed on Aug. 4, 2021, the entire contents of each are incorporated herein by reference.

TECHNICAL FIELD

The present disclosure relates to a plasma processing apparatus.

BACKGROUND

In Patent Document 1, there known a configuration of a capacitively coupled plasma processing apparatus including an electromagnet assembly disposed in the upper portion or on the upper side of a chamber. The capacitively coupled plasma processing apparatus of Patent Document 1 includes an upper electrode that also functions as a shower head. The configuration of the apparatus of Patent Document 1 prevents the processing speed of plasma processing performed in the plasma processing apparatus from increasing locally in a central portion of a substrate.

PRIOR ART DOCUMENT

Patent Document

Patent Document 1: Japanese Patent Laid-Open Publication No. 2021-044535

SUMMARY

According to one embodiment of the present disclosure, a plasma processing apparatus including: a plasma processing chamber; a substrate support disposed inside the plasma processing chamber; a lower electrode disposed within the substrate support; at least one RF power supply coupled to the lower electrode; and an upper electrode assembly disposed above the substrate support, wherein the upper electrode assembly includes a gas diffusion plate having at least one first gas supply port for a first gas and at least one second gas supply port for a second gas; an insulating plate; and an upper electrode plate arranged between the gas diffusion plate and the insulating plate, and having a plurality of first through holes in communication with the at least one first gas supply port and a plurality of second through holes in communication with the at least one second gas supply port, wherein the insulating plate includes an inner annular protrusion and an outer annular protrusion protruding downward from a lower surface of the insulating plate, and wherein the insulating plate has a plurality of first gas introduction holes formed in the inner annular protrusion, each of the first gas introduction holes being in communication with the at least one first gas supply port through any of the plurality of first through holes, a plurality of second gas introduction holes formed in the outer annular protrusion, each of the second gas introduction holes being in communication with the at least one first gas supply port though any of the plurality of first through holes, and a plurality of third gas introduction holes formed outside the second gas introduction holes, each of the third gas introduction holes being in communication with the at least one second gas supply port through any of the plurality of second through holes.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3B is a schematic plan view of the insulating plate according to the first embodiment.

FIG. 4 is a schematic explanatory diagram showing a configuration of an insulating plate according to a second embodiment.

FIG. 5 is a schematic explanatory diagram showing a configuration of an insulating plate according to a third embodiment.

DETAILED DESCRIPTION

Figure 1:
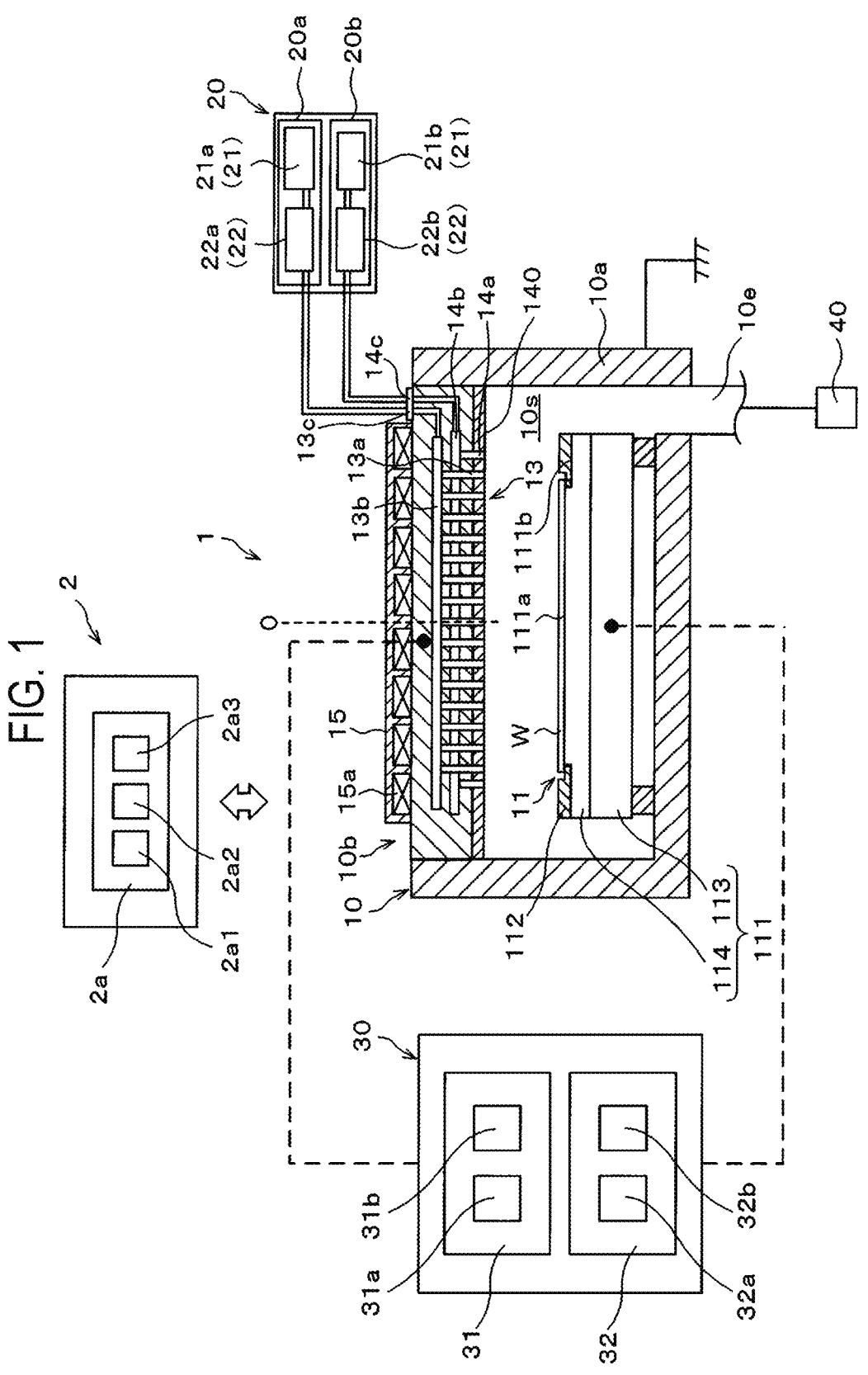
FIG. 1 is an explanatory diagram schematically showing a configuration of a plasma processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device manufacturing process, various plasma processes such as an etching process, a film-forming process, a diffusion process, and the like are performed on a semiconductor substrate (hereinafter simply referred to as "substrate") supported by a substrate support by exciting a processing gas supplied into a chamber and generating plasma. These plasma processes are performed using, for example, a capacitively coupled plasma (CCP) processing apparatus including an upper electrode assembly as a gas diffuser that constitutes at least a portion of a chamber top portion (top plate).

For example, when performing an etching process using a mask in a plasma processing apparatus, it is known that the remaining film state of the mask or the like differs between the peripheral portion and the central portion of a substrate even during the same processing process. In order to prevent such unevenness in the remaining film state of the mask or the like on the substrate, for example, by-products (deposits) generated during the etching process and adhering to the upper electrode are required to be reduced by making uniform a processing gas or the like introduced from the upper electrode assembly as a gas diffuser or introducing an additive gas. By making the process uniform, it is expected that the remaining film state of the mask or the like can be made uniform and the etching process can be performed effectively.

Further, when an etching process is performed as a plasma process, the plasma density may differ between the peripheral portion and the central portion of the substrate, and the process may become non-uniform. Due to this, the size of etching holes may also become non-uniform, and for example, the size of etching holes at the peripheral portion of the substrate may be smaller than that at the central portion. In the plasma processing apparatus, it is known that additional gases are introduced in addition to the processing gas (etching gas) for various purposes such as protection of the inner wall or the like. It is presumed that the plasma density becomes non-uniform due to the influence of flow of these gases, and there is room for improvement in the arrangement and configuration of the gas introduction holes in the gas diffuser.

However, the plasma processing apparatus mentioned in Patent Document 1 has been developed with a focus on the plasma processing speed on the substrate, particularly in order to solve the problem that the processing speed becomes locally high at the center of the substrate. The related art mentioned in Patent Document 1 is mainly directed to a technique related to the lower electrode of a plasma processing apparatus and its vicinity, and is not directed to a technical idea regarding the process uniformity that focuses on the gas diffuser of the plasma processing apparatus. That is, when aiming to improve the uniformity of a plasma process on a substrate in a plasma processing apparatus, there is room for further improvement, particularly in the technique related to the gas diffuser and its vicinity.

Hereinafter, a plasma processing system according to one embodiment and a plasma processing method including an etching method according to the present embodiment will be described with reference to the drawings. In the specification and the drawings, elements having substantially the same functional configuration are designated by like reference numerals and redundant descriptions thereof will be omitted.

Plasma Processing System

First, a plasma processing system according to the present embodiment will be described. FIG. 1 is a vertical cross-sectional view schematically showing a configuration of the plasma processing system according to the present embodiment.

The plasma processing system includes a capacitively coupled plasma processing apparatus 1 and a controller 2. The plasma processing apparatus 1 includes a plasma processing chamber 10, a gas supply 20, a power supply 30, and an exhaust system 40. Further, the plasma processing apparatus 1 includes a substrate support 11 and a gas introduction unit. The substrate support 11 is arranged within the plasma processing chamber 10. The gas introduction unit is configured to introduce at least one processing gas into the plasma processing chamber 10. The gas introduction unit includes an upper electrode assembly 13. The upper electrode assembly 13 is disposed above the substrate support 11, and an insulating plate 140 whose lower surface is exposed to a plasma is disposed. In one embodiment, the upper electrode assembly 13 is disposed in an upper portion of the plasma processing chamber 10, and is attached to, for example, a top plate 10b (ceiling). An electromagnet unit 15 having coils 15a therein is disposed on or above the plasma processing chamber 10.

Inside the plasma processing chamber 10, a plasma processing space 10s defined by the upper electrode assembly 13, the top plate 10b, the side wall 10a of the plasma processing chamber 10, and the substrate support 11 is formed. The plasma processing chamber 10 has at least one gas supply port for supplying at least one processing gas to the plasma processing space 10s, and at least one gas discharge port for discharging gases from the plasma processing space 10s. The side wall 10a is grounded. The upper electrode assembly 13 and the substrate support 11 are electrically isolated from the plasma processing chamber 10.

The substrate support 11 includes a main body 111 and a ring assembly 112. The upper surface of the main body 111 has a central region 111a (substrate support surface) for supporting a substrate (wafer) W, and an annular region 111b (ring support surface) for supporting the ring assembly 112. The annular region 111b surrounds the central region 111a in a plan view. The ring assembly 112 includes one or more annular members. At least one of the one or more annular members is an edge ring.

In one embodiment, the main body 111 includes a base 113 and an electrostatic chuck 114. The base 113 includes a conductive member. The conductive member of the base 113 functions as a lower electrode. The electrostatic chuck 114 is placed on the upper surface of the base 113. The upper surface of the electrostatic chuck 114 has the aforementioned central region 111a and annular region 111b.

Although not shown, the substrate support 11 may include a temperature control module configured to adjust the temperature of at least one of the ring assembly 112, the electrostatic chuck 114, or the substrate W to a target temperature. The temperature control module may include a heater, a heat transfer medium, a flow path, or a combination thereof. A heat transfer fluid such as brine or gas flows through the flow path. Further, the substrate support 11 may include a heat transfer gas supply configured to supply a heat transfer gas (backside gas) to between the back surface of the substrate W and the upper surface of the electrostatic chuck 114.

The gas supply 20 may include at least one gas source 21 and at least one flow controller 22. In one embodiment, the at least one gas source 21 includes a main gas source 21a and an additive gas source 21b. In one embodiment, the gas supply 20 is configured to supply at least one processing gas from each corresponding gas source 21 to the upper electrode assembly 13 via each corresponding flow controller 22. The at least one processing gas includes a main gas and an additive gas. The main gas is an example of a first gas, and the additive gas is an example of a second gas. In one embodiment, the gas supply 20 includes a main gas supply 20*a* for the main gas and an additive gas supply 20*b* for the additive gas. The main gas supply 20*a* is configured to supply the main gas from the main gas source 21*a* to a first gas supply port 13*c* of the upper electrode assembly 13 via the flow controller 22*a*. The additive gas supply 20*b* is configured to supply the additive gas from the additive gas source 21*b* to a second gas supply port 14*c* of the upper electrode assembly 13 via the flow controller 22*b*. Each flow controller 22 may include, for example, a mass flow controller or a pressure-controlled flow controller. In addition, the gas supply 20 may include one or more flow modulation devices that modulate or pulse the flow of at least one processing gas.

The power supply 30 includes an RF power supply 31 coupled to the plasma processing chamber 10 via at least one impedance matching circuit. The RF power supply 31 is configured to supply at least one RF signal (RF power), such as a source RF signal and a bias RF signal, to the conductive member (lower electrode) of the substrate support 11 and/or the conductive member (upper electrode) of the upper electrode assembly 13. Thus, plasma is formed from at least one processing gas supplied to the plasma processing space 10*s*. Accordingly, the RF power supply 31 may function as at least a part of a plasma generator configured to generate a plasma from one or more processing gases in the plasma processing chamber 10. Further, by supplying the bias RF signal to the lower electrode, a bias potential can be generated on the substrate W, and ion components in the formed plasma can be drawn into the substrate W.

In one embodiment, the RF power supply 31 includes a first RF generator 31*a* and a second RF generator 31*b*. The first RF generator 31*a* is coupled to the lower electrode and/or the upper electrode via at least one impedance matching circuit, and is configured to generate a source RF signal (source RF power) for plasma generation. In one embodiment, the source RF signal has a frequency within a range of 13 MHz to 160 MHz. In one embodiment, the first RF generator 31*a* may be configured to generate a plurality of source RF signals having different frequencies. The generated one or more source RF signals are provided to the lower electrode and/or the upper electrode. The second RF generator 31*b* is coupled to the lower electrode via at least one impedance matching circuit, and is configured to generate a bias RF signal (bias RF power). In one embodiment, the bias RF signal has a lower frequency than the source RF signal. In one embodiment, the bias RF signal has a frequency within a range of 400 kHz to 13.56 MHz. In one embodiment, the second RF generator 31*b* may be configured to generate a plurality of bias RF signals having different frequencies. The generated one or more bias RF signals are supplied to the lower electrode. In various embodiments, at least one of the source RF signal or the bias RF signal may be pulsed.

The power supply 30 may further include a DC power supply 32 coupled to the plasma processing chamber 10. The DC power supply 32 includes a first DC generator 32*a* and a second DC generator 32*b*. In one embodiment, the first DC generator 32*a* is connected to the lower electrode and configured to generate a first DC signal. The generated first DC signal is applied to the lower electrode. In one embodiment, the first DC signal may be applied to other electrodes such as an attraction electrode within the electrostatic chuck

114, and the like. In one embodiment, the second DC generator 32*b* is connected to the upper electrode and configured to generate a second DC signal. The generated second DC signal is applied to the upper electrode. In various embodiments, at least one of the first or second DC signals may be pulsed. The first and second DC generators 32*a* and 32*b* may be provided in addition to the RF power supply 31, or the first DC generator 32*a* may be provided in place of the second RF generator 31*b*.

The exhaust system 40 may be connected to the gas discharge port 10*e* provided at the bottom of the plasma processing chamber 10, for example. The exhaust system 40 may include a pressure regulation valve and a vacuum pump. The pressure regulation valve regulates the pressure inside the plasma processing space 10*s*. The vacuum pump may include a turbomolecular pump, a dry pump, or a combination thereof.

The controller 2 processes computer-executable instructions that cause the plasma processing apparatus 1 to perform various processes described in the present disclosure. The controller 2 may be configured to control each element of the plasma processing apparatus 1 to perform the various processes described herein. In one embodiment, a part or the entirety of the controller 2 may be included in the plasma processing apparatus 1. The controller 2 may include, for example, a computer 2*a*. The computer 2*a* may include, for example, a processing part (CPU: Central Processing Unit) 2*a*1, a memory part 2*a*2, and a communication interface 2*a*3. The processing part 2*a*1 may be configured to perform various control operations based on programs stored in the memory part 2*a*2. The memory part 2*a*2 may include a RAM (Random Access Memory), a ROM (Read Only Memory), an HDD (Hard Disk Drive), an SSD (Solid State Drive), or a combination thereof. The communication interface 2*a*3 may communicate with the plasma processing apparatus 1 via a communication line such as a LAN (Local Area Network) or the like.

<Upper Electrode Assembly>

Figures 2, 3A:
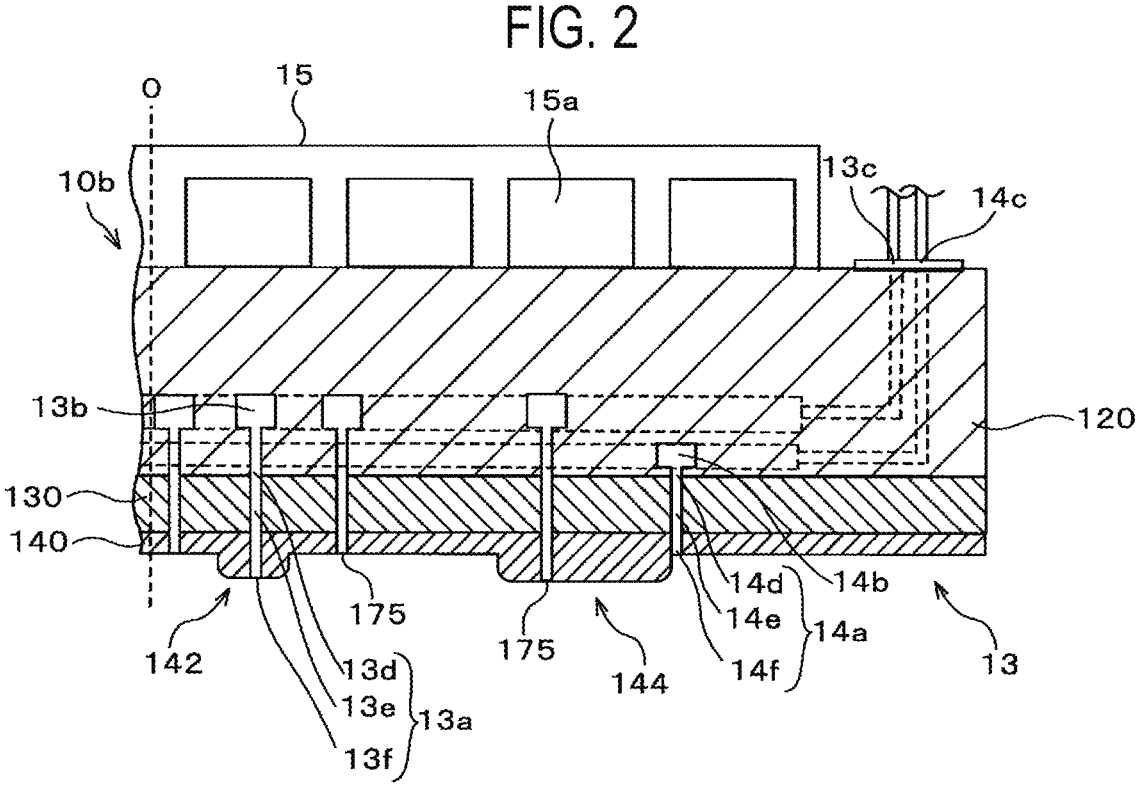
FIG. 2 is an enlarged explanatory diagram showing a portion of an upper electrode assembly.
FIG. 3A is a schematic explanatory diagram showing a configuration of an insulating plate according to a first embodiment.

Next, the upper electrode assembly 13 as the gas diffuser described above and the constituent elements of the plasma processing apparatus 1 attached to the upper electrode assembly 13 will be described with reference to FIGS. 1 and 2. FIG. 2 is an enlarged explanatory diagram showing a portion of the upper electrode assembly 13. FIG. 2 shows, in an enlarged manner, a portion of the upper electrode assembly 13 (one side of the line-symmetrical shape) having a line-symmetrical shape with respect to the center in the width direction (center line O in the figure) of the top plate 10*b* shown in FIG. 1.

As shown in FIG. 2, the upper electrode assembly 13 constitutes a part or the entirety of the top plate 10*b* of the plasma processing chamber 10, and functions as a gas diffuser that diffuses and introduces at least one processing gas into the plasma processing space 10*s*. The upper electrode assembly 13 includes a gas diffusion plate 120, an upper electrode plate 130, and an insulating plate 140. The upper electrode plate 130 is disposed between the gas diffusion plate 120 and the insulating plate 140. The gas diffusion plate 120, the upper electrode plate 130, and the insulating plate 140 are vertically stacked. The gas diffusion plate 120 has at least one first gas supply port 13*c* for the first gas and at least one second gas supply port 14*c* for the second gas. In addition, at least one gas diffusion space 13*b*, which is a space for the main gas diffusion, may be formed in the gas diffusion plate 120. Further, at least one gas diffusion space 14*b*, which is a space for diffusing the additive gas, may be formed in the gas diffusion plate 120.

That is, the upper electrode assembly 13 includes the gas diffusion plate 120, the upper electrode plate 130, and the insulating plate 140 arranged in the named order from the top.

The gas diffusion plate 120 is formed of a first conductive material. In one embodiment, the first conductive material is Al (aluminum). The upper electrode plate 130 is formed of a second conductive material. The second conductive material is different from the first conductive material. In one embodiment, the second conductive material is Si (silicon). The insulating plate 140 is made of an insulating material. In one embodiment, the insulating material is quartz. The insulating plate 140 has a lower surface (plasma exposure surface) exposed to the plasma processing space 10s. A plurality of first gas introduction paths 13a are formed through the upper electrode plate 130 and the insulating plate 140 in the thickness direction (vertical direction) thereof. The first gas introduction paths 13a are connected to the gas supply 20 via the gas diffusion space 13b and the gas supply port 13c. Gas outlets 13d are formed in the gas diffusion plate 120. The main gas diffused in the gas diffusion space 13b is introduced into the plasma processing space 10s through the gas outlets 13d, the first through holes 13e formed inside the upper electrode plate 130, and the gas introduction holes 13f formed in the insulating plate 140. That is, the first gas introduction path 13a has a gas outlet 13d, a first through hole 13e, and a gas introduction hole 13f, and is configured to introduce the main gas from the main gas supply 20a into the plasma processing space 10s. In one embodiment, the upper electrode plate 130 is disposed between the gas diffusion plate 120 and the insulating plate 140. Further, the upper electrode plate 130 has a plurality of first through holes 13e and a plurality of second through holes 14e. The plurality of first through holes 13e are in communication with at least one first gas supply port 13c via the gas diffusion space 13b of the gas diffusion plate 120 and the gas outlet 13d. The plurality of second through holes 14e are in communication with at least one second gas supply port 14c via a gas diffusion space 14b and a gas outlet 14d of the gas diffusion plate 120.

The number and arrangement of the gas introduction paths are arbitrary, and other gas introduction paths may be provided in addition to the first gas introduction path 13a. For example, as shown in FIG. 2, a second gas introduction path 14a including a gas outlet 14d, a second through hole 14e, and a gas introduction hole 14f may be provided. An additive gas different from the main gas may be introduced into the plasma processing space 10s from the gas diffusion space 14b and the gas supply port 14c. A mixed gas containing a plurality of types of gases may be introduced from the second gas introduction path 14a. Although not shown in FIGS. 1 and 2, a third gas introduction path and a fourth gas introduction path may be provided. Details of the number and arrangement of gas introduction paths (gas introduction holes) opened on the lower surface of the insulating plate 140 according to the present embodiment will be described later with reference to the drawings.

An electromagnet unit 15 having a coil 15a therein is arranged at the upper portion or on the upper side of the plasma processing chamber 10. In one embodiment, the electromagnet unit 15 is approximately circular in a plan view. The electromagnet unit 15 is configured to generate a magnetic field within the plasma processing chamber 10 by allowing a current to flow from an external current source (not shown) through the coil 15a. The power supply 30 shown in FIG. 1 may be used as a power supply for the electromagnet unit 15. Various configurations may be applied to the electromagnet unit 15. For example, the configuration described in Patent Document 1 may be applied to the electromagnet unit 15.

The gas diffusion plate 120 may be provided with a coolant flow path (not shown) through which a heat transfer fluid such as brine or gas circulates to and from a chiller outside the apparatus. The coolant flow path adjusts the temperature of the insulating plate 140 whose temperature fluctuates due to plasma heat input, for example. For example, the coolant flow path may be provided inside the upper electrode plate 130, or a metal plate having the coolant flow path may be provided at an upper portion of the gas diffusion plate 120.

The insulating plate 140 is disposed to cover the lower surface of the upper electrode plate 130. At least two annular protrusions protruding downward are formed on the lower surface of the insulating plate 140. In one embodiment, as shown in FIG. 2, an inner annular protrusion 142 and an outer annular protrusion 144 are formed on the lower surface of the insulating plate 140. Both the inner annular protrusion 142 and the outer annular protrusion 144 have an annular shape in a plan view. In a plan view, the diameter of the inner annular protrusion 142 is smaller than the diameter of the outer annular protrusion 144. In a plan view, a part or the entirety of the outer annular protrusion 144 may overlap with the central region 111a (substrate support surface) of the substrate support 11 for supporting the substrate W.

As described above, the plurality of gas introduction paths (e.g., the gas introduction paths 13a and the gas introduction paths 14a), and the corresponding gas introduction holes (e.g., the gas introduction holes 13f and the gas introduction paths 14f) are formed in the insulating plate 140. The detailed positional relationship and arrangement configuration of the plurality of gas introduction holes and the inner annular protrusion 142 and the outer annular protrusion 144 formed on the lower surface of the insulating plate 140 will be described below. The insulating plate 140 may have not only the gas introduction holes 13f and 14f, but also gas introduction holes 175 having an arbitrary arrangement configuration as described later.

First Embodiment of Insulating Plate

FIG. 3A is a schematic explanatory diagram showing a configuration of an insulating plate 140 according to a first embodiment, and is an enlarged view of a part thereof (one side of the line-symmetrical shape). Further, FIG. 3B is a schematic plan view of the insulating plate 140 according to the first embodiment. As shown, in the insulating plate 140, an inner annular protrusion 142 and an outer annular protrusion 144 protruding downward from the lower surface are formed in the named order from the inside. In one embodiment, a radial width W2 of the outer annular protrusion 144 may be greater than a radial width W1 of the inner annular protrusion 142. In one embodiment, a protrusion dimension H2 of the outer annular protrusion 144 may be greater than a protrusion dimension H1 of the inner annular protrusion 142. By making the width and protrusion dimension of the outer annular protrusion 144 greater than the width and protrusion dimension of the inner annular protrusion 142, the area to be scraped away when manufacturing the insulating plate 140 is reduced, and the workability is improved.

In one embodiment, one or both of the inner annular protrusion 142 and the outer annular protrusion 144 have a substantially rectangular shape. The "substantially rectangular shape" referred to herein may be, for example, a so-called round shape with rectangular chamfered lower corners in a cross-sectional view, as shown in FIG. 3A. In one embodiment, one or both of the inner annular protrusion 142 and the outer annular protrusion 144 may have a substantially semicircular shape in a cross-sectional view.

By forming the inner annular protrusion 142 and the outer annular protrusion 144 on the insulating plate 140, the region where the inner annular protrusion 142 and the outer annular protrusion 144 are formed has a larger member thickness than other regions. This increases the plasma density near the center of the plasma processing space 10s, i.e., the central portion of the substrate W, thereby improving the uniformity of a plasma process.

The insulating plate 140 has a plurality of first gas introduction holes 150 formed in the inner annular protrusion 142. Each first gas introduction hole 150 is in communication with at least one first gas supply port 13c via any of the plurality of first through holes 13e. In one embodiment, the first gas introduction holes 150 are arranged at equal intervals in the circumferential direction along the circumference of a first circle having a first diameter. The first gas introduction holes 150 may be formed near the inner wall 151 of the inner annular protrusion 142. When the inner annular protrusion 142 has a round shape or a substantially semicircular shape in a cross-sectional view, a gas flow toward the inside of the plasma processing space 10s is formed by forming the first gas introduction holes 150 near the inner wall 151. The first gas introduction holes 150 are in communication with the gas outlets (e.g., the gas outlets 13d shown in FIG. 2) of the gas diffusion plate 120 to introduce the main gas into the plasma processing space 10s. In one embodiment, the first gas introduction holes 150 overlap with the substrate support surface 111a of the substrate support 11 in a plan view (see FIGS. 10 and 11).

The insulating plate 140 has a plurality of second gas introduction holes 160 formed in the outer annular protrusion 144. Each second gas introduction hole 160 is in communication with at least one first gas supply port 13c via any of the plurality of first through holes 13e. In one embodiment, the second gas introduction holes 160 are arranged at equal intervals in the circumferential direction along the circumference of a second circle having a second diameter larger than the first diameter. The second gas introduction holes 160 are in communication with the gas outlets (e.g., the gas outlets 13d shown in FIG. 2) of the gas diffusion plate 120 to introduce the main gas into the plasma processing space 10s. In one embodiment, the second gas introduction holes 160 overlap with the substrate support surface 111a of the substrate support 11 in a plan view (see FIGS. 10 and 11).

The insulating plate 140 has a plurality of third gas introduction holes 170 formed outside the second gas introduction holes 160. Each third gas introduction hole 170 is in communication with at least one second gas supply port 14c via any of the plurality of second through holes 14e. In one embodiment, the third gas introduction holes 170 are arranged at equal intervals in the circumferential direction along the circumference of a third circle having a third diameter larger than the second diameter. The third gas introduction holes 170 may be formed in the outer proximal end portion 171 of the outer annular protrusion 144. The third gas introduction holes 170 are in communication with the gas outlets (e.g., the gas outlets 14d shown in FIG. 2) of the gas diffusion plate 120 to introduce the additive gas into the plasma processing space 10s. In one embodiment, the third gas introduction holes 170 do not overlap with the substrate support surface 111a of the substrate support 11 in a plan view (see FIGS. 10 and 11).

In one embodiment, as shown in FIGS. 3A and 3B, the insulating plate 140 may include additional gas introduction holes 175 in addition to the first gas introduction holes 150, the second gas introduction holes 160, and the third gas introduction holes 170. The arrangement and number of the gas introduction holes 175 are arbitrary. For example, the gas introduction holes 175 may be formed inside the inner annular protrusion 142 and between the inner annular protrusion 142 and the outer annular protrusion 144 as shown in the figures.

Although an example of the positional relationship and arrangement of the inner annular protrusion 142 and the outer annular protrusion 144 formed on the insulating plate 140 and the gas introduction holes has been described with reference to FIGS. 3A and 3B, the present disclosure is not limited thereto.

Second Embodiment of Insulating Plate

FIG. 4 is a schematic explanatory diagram showing a configuration of an insulating plate 140 according to a second embodiment. As shown in FIG. 4, in one embodiment, the third gas introduction holes 170 may be located outside the outer annular protrusion 144.

Third Embodiment of Insulating Plate

FIG. 5 is a schematic explanatory diagram showing a configuration of an insulating plate 140 according to a third embodiment. As shown in FIG. 5, in one embodiment, the third gas introduction holes 170 may be provided in the outer annular protrusion 144.

Fourth Embodiment of Insulating Plate

Figure 6:
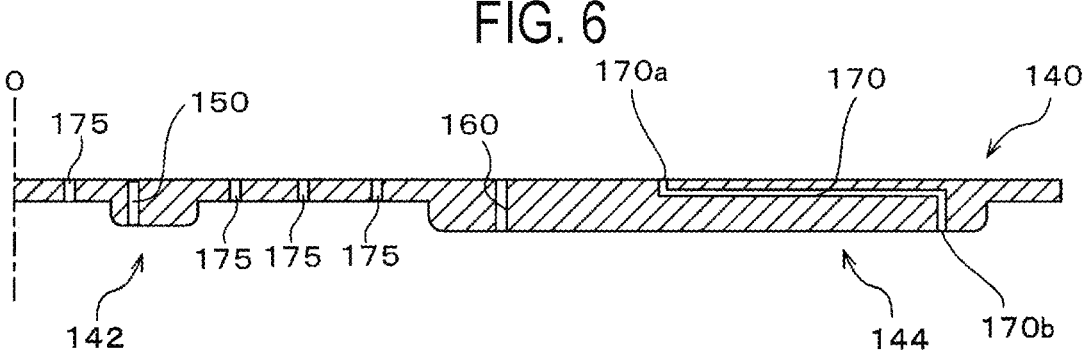
FIG. 6 is a schematic explanatory diagram showing a configuration of an insulating plate according to a fourth embodiment.

FIG. 6 is a schematic explanatory diagram showing a configuration of an insulating plate 140 according to a fourth embodiment. As shown in FIG. 6, in one embodiment, the third gas introduction holes 170 may be provided in the outer annular protrusion 144. Each of the third gas introduction holes 170 may have an upper end inlet 170a and a lower end outlet 170b which are located at different positions in the radial direction. That is, the shape of the third gas introduction holes 170 may be arbitrarily designed according to the width of the outer annular protrusion 144 in the radial direction.

Fifth Embodiment of Insulating Plate

Figure 7:
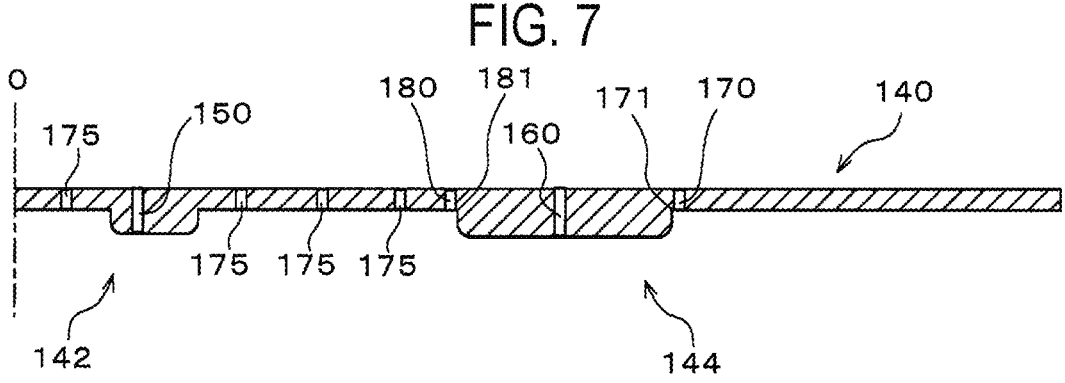
FIG. 7 is a schematic explanatory diagram showing a configuration of an insulating plate according to a fifth embodiment.

FIG. 7 is a schematic explanatory diagram showing a configuration of an insulating plate 140 according to a fifth embodiment. In one embodiment, the insulating plate 140 has a plurality of fourth gas introduction holes 180 formed at an inner proximal end portion 181 of the outer annular protrusion 144, as shown in FIG. 7. Each fourth gas introduction hole 180 is in communication with at least one first gas supply port 13c via any of the plurality of first through holes 13e. In one embodiment, the fourth gas introduction holes 180 are arranged at equal intervals in the circumferential direction along the circumference of a fourth circle having a fourth diameter larger than the first diameter and smaller than the second diameter. The fourth gas introduction holes 180 may be provided at the inner proximal end portion 181 of the outer annular protrusion 144. These fourth gas introduction holes 180 are in communication with the gas outlets (e.g., the gas outlets 13*d* shown in FIG. 2) of the gas diffusion plate 120 to introduce the main gas into the plasma processing space 10*s*.

Sixth Embodiment of Insulating Plate

Figure 8:
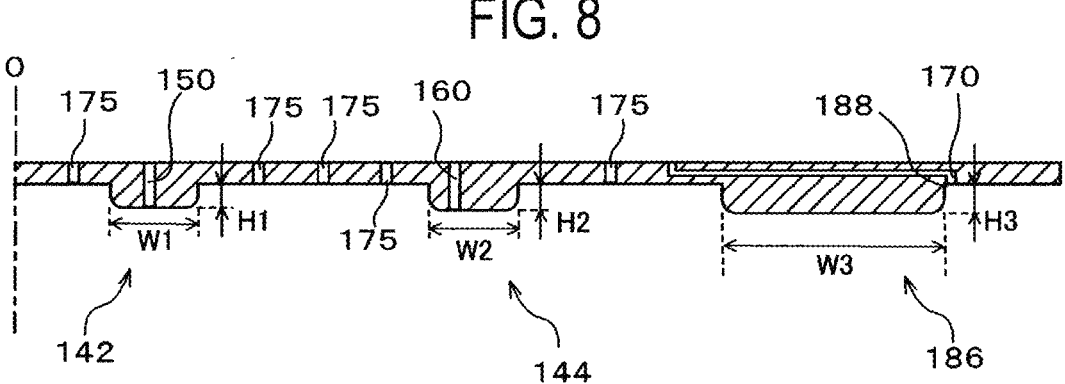
FIG. 8 is a schematic explanatory diagram showing a configuration of an insulating plate according to a sixth embodiment.

FIG. 8 is a schematic explanatory diagram showing a configuration of an insulating plate 140 according to a sixth embodiment. As shown in FIG. 8, in one embodiment, an additional outer annular protrusion 186 protruding downward from the lower surface of the insulating plate 140 may be formed further radially outward of the outer annular protrusion 144. In one embodiment, a radial width W3 of the additional outer annular protrusion 186 may be greater than the width W2 of the outer annular protrusion 144. A protrusion dimension H3 of the additional outer annular protrusion 186 may be greater than the protrusion dimension H2 of the outer annular protrusion 144. The third gas introduction holes 170 may be formed at an outer proximal end portion 188 of the additional outer annular protrusion 186.

Seventh Embodiment of Insulating Plate

Figures 9, 10:
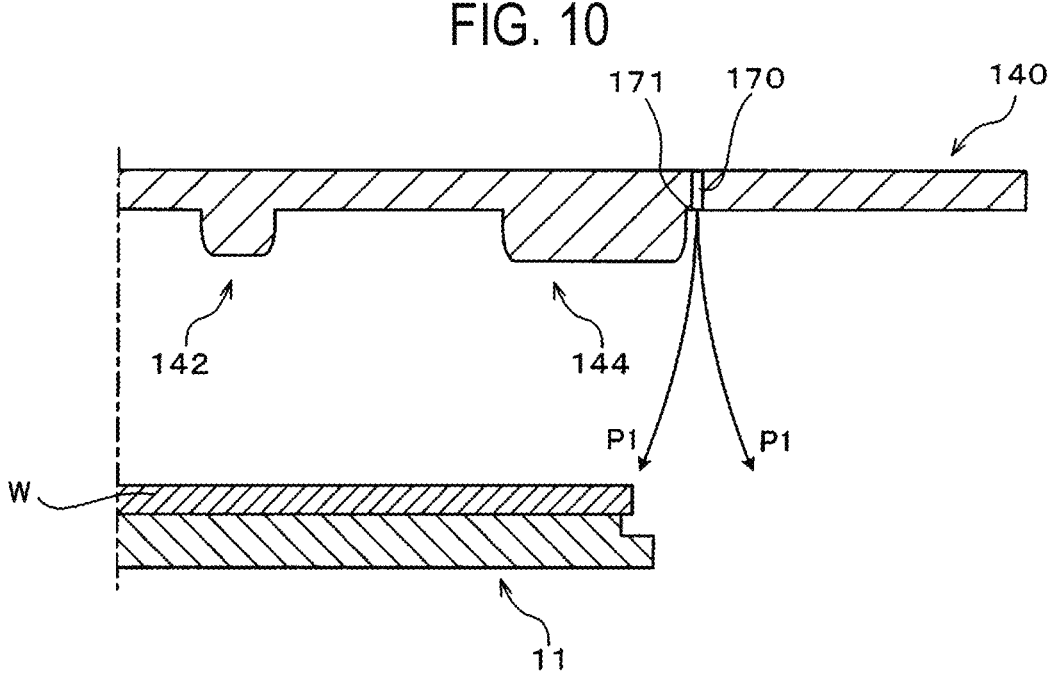
FIG. 9 is a schematic explanatory diagram showing a configuration of an insulating plate according to a seventh embodiment.
FIG. 10 is a schematic explanatory diagram of a gas flow in one embodiment of the present disclosure.

FIG. 9 is a schematic explanatory diagram showing a configuration of an insulating plate 140 according to a seventh embodiment. As shown in FIG. 9, in the insulating plate 140 according to the sixth embodiment, the third gas introduction holes 170 may be provided in the additional outer annular protrusion 186.
<Substrate Processing Method Using Plasma Processing Apparatus>

Next, an example of a method for processing the substrate W in the plasma processing apparatus 1 configured as described above will be described. In the plasma processing apparatus 1, various plasma processes such as an etching process, a film-forming process, a diffusion process, and the like are performed on the substrate W.

First, the substrate W is loaded into the plasma processing chamber 10 and placed on the electrostatic chuck 114 of the substrate support 11. Next, a voltage is applied to the attraction electrode of the electrostatic chuck 114, whereby the substrate W is attracted and held on the electrostatic chuck 114 by an electrostatic force.

When the substrate W is attracted and held by the electrostatic chuck 114, the inside of the plasma processing chamber 10 is then depressurized into a vacuum environment. Next, a processing gas is supplied from the gas supply 20 to the plasma processing space 10*s* via the upper electrode assembly 13. Further, the source RF power for plasma generation is supplied from the first RF generator 31*a* to the upper electrode or the lower electrode, thereby exciting the processing gas and generating plasma. In addition, the bias RF power may be supplied to the lower electrode from the second RF generator 31*b*. Then, in the plasma processing space 10*s*, the substrate W is subjected to a plasma process by the action of the generated plasma.

At this time, a magnetic field is generated within the plasma processing space 10*s* by the electromagnet unit 15. Further, as described above, by forming the inner annular protrusion 142 and the outer annular protrusion 144 on the insulating plate 140, it is possible to improve the uniformity of the plasma process. In addition, when an additive gas is introduced into the plasma processing space 10*s* in addition to the main gas during the plasma process, by appropriately designing the arrangement of the gas introduction holes, and the like, it is possible to prevent the additive gas from going around toward the center of the substrate W.

When finishing the plasma process, the supply of the source RF power from the first RF generator 31*a* and the supply of the processing gas from the gas supply 20 are stopped. If the bias RF power is being supplied during the plasma process, the supply of the bias RF power is also stopped.

Next, the attraction and holding of the substrate W by the electrostatic chuck 114 is stopped, and static electricity is removed from the substrate W and the electrostatic chuck 114 after the plasma process. Thereafter, the substrate W is detached from the electrostatic chuck 114, and the substrate W is unloaded from the plasma processing apparatus 1. In this way, a series of plasma processes are completed.

Actions and Effects of the Technique of the Present Disclosure

In the embodiments described above, for example, the inner annular protrusion 142 and the outer annular protrusion 144 as shown in FIGS. 3A and 3B are formed on the lower surface of the insulating plate 140. This increases the plasma density in a specific region of the plasma processing space 10*s*, for example, in the central portion of the substrate W, and improves the uniformity of the plasma process. That is, it is possible to improve the uniformity of the plasma process on the substrate W.

In the above-described embodiment, the plurality of gas introduction holes are provided in each of the protrusions such as the inner annular protrusion 142, the outer annular protrusion 144, and the additional outer annular protrusion 186 formed on the lower surface of the insulating plate 140, or in the proximal end portion of each of the protrusions. Thus, the gas distribution of the main gas and the additive gas introduced into the plasma processing space 10*s* can be suitably changed, and the uniformity of the plasma process on the substrate W can be improved. For example, by providing the third gas introduction holes 170 outside the second gas introduction holes 160, the additive gas introduced from the third gas introduction holes 170 can be prevented from going around toward the vicinity of the central portion of the substrate W.

For example, as shown in FIG. 10, when the third gas introduction holes 170 are formed in the outer proximal end portion 171 of the outer annular protrusion 144 (see FIGS. 3A, 3B and 7), the additive gas or the mixed gas introduced therethrough flows toward the vicinity of the peripheral edge portion of the substrate W and the outside thereof, as indicated by P1 in the figure. That is, the outer wall of the outer annular protrusion 144 serves as a wall, and the additive gas or the mixed gas is prevented from going around toward the vicinity of the central portion of the substrate W, which makes it possible to improve controllability of the gas flow.

Figure 11:
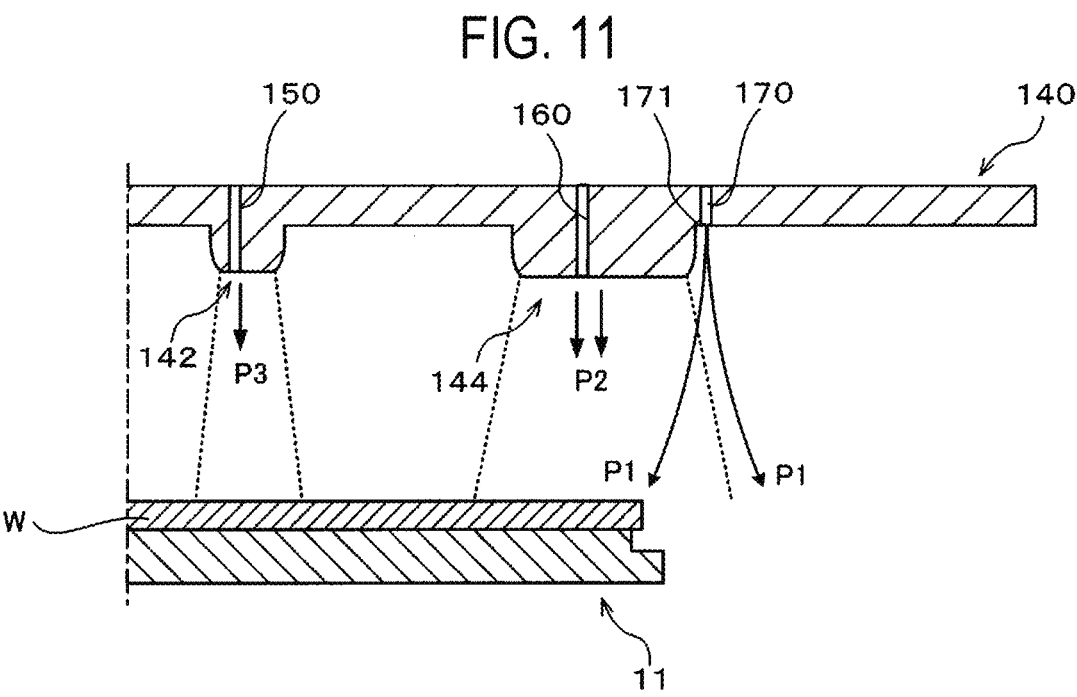
FIG. 11 is a schematic explanatory diagram of a gas flow in one embodiment of the present disclosure.

Further, as shown in FIG. 11, when the second gas introduction holes 160 are formed in the outer annular protrusion 144 (see FIGS. 3A to 9), the flow P1 of the additive gas or the mixed gas introduced from the third gas introduction holes 170 is blocked by the flow P2 of the processing gas introduced from the second gas introduction holes 160, and is prevented from going around toward the vicinity of the central portion of the substrate. Further, the first gas introduction holes 150 are provided in the inner annular protrusion 142. The flow P3 of the processing gas introduced therefrom prevents the gas flows P1 and P2 from going around toward the vicinity of the central portion of the substrate W.

13

Figure 12:
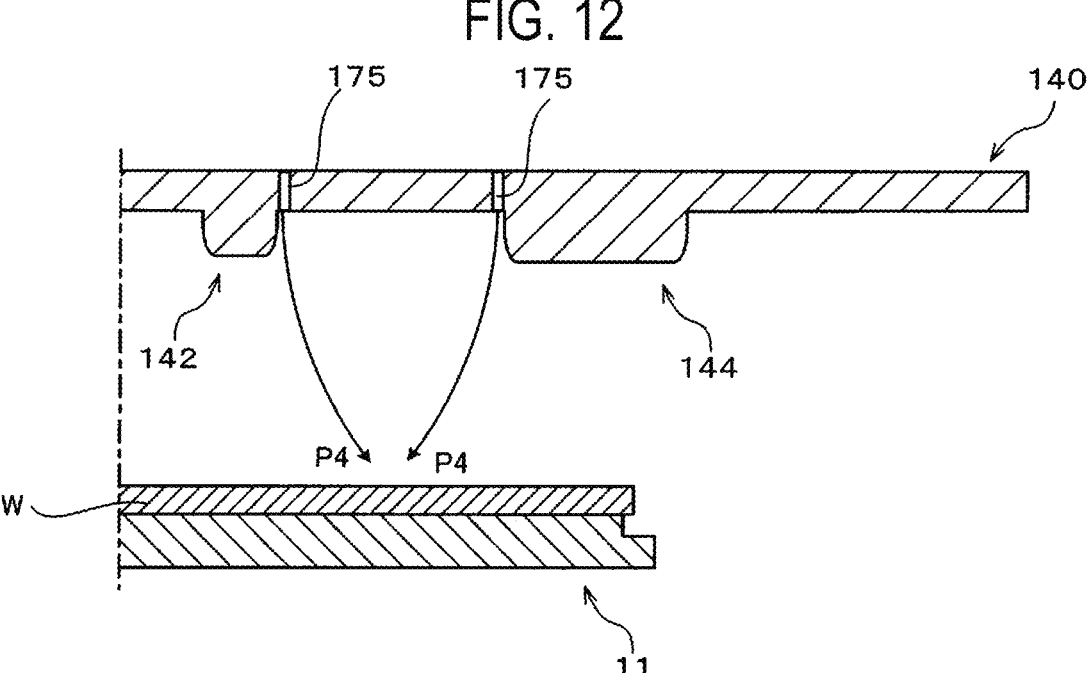
FIG. 12 is a schematic explanatory diagram of a gas flow in one embodiment of the present disclosure.
Figure 13:
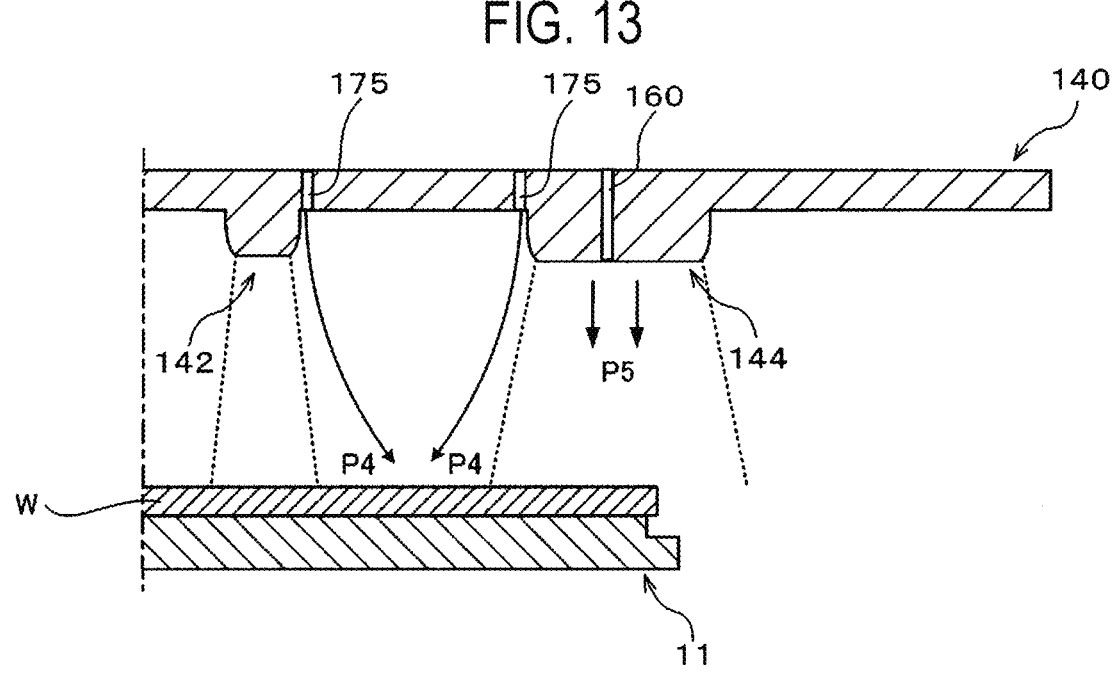
FIG. 13 is a schematic explanatory diagram of a gas flow in one embodiment of the present disclosure.

Further, for example, as shown in FIG. 12, by providing the inner annular protrusion 142 and the outer annular protrusion 144, as indicated by P4 in the figure, the flow of the processing gas introduced from any gas introduction hole 175 formed between these protrusions is not concentrated near the central portion of the substrate W. Further, as shown in FIG. 13, the second gas introduction holes 160 are formed in the outer annular protrusion 144 to introduce the processing gas as indicated by P5 in the figure. This can prevent the processing gas (P4 in the figure) introduced from any gas introduction hole 175 formed between the protrusions from escaping outward due to the gas curtain effect. That is, due to the presence of walls and the gas curtain effect accompanying the formation of the protrusions, radicals (neutral particles) are concentrated in the central portion of the substrate W, thereby improving the uniformity of the plasma process.

In the above-described embodiment, the case has been described in which the protrusions such as the inner annular protrusion 142 and the outer annular protrusion 144 are formed on the lower surface of the insulating plate 140 included in the upper electrode assembly 13, and the plurality of gas introduction holes are provided. However, the technique of the present disclosure is not limited thereto. The technique of the present disclosure is applicable to an exposed surface exposed to plasma (hereinafter also simply referred to as an exposed surface) of the upper electrode assembly 13 included in the plasma processing apparatus 1.

When the upper electrode assembly 13 has an exposed surface as a plasma exposure surface, for example, on its lower surface, the exposed surface may have the following configuration. That is, in one embodiment, the inner annular protrusion 142 and the outer annular protrusion 144 protruding downward may be formed on the exposed surface. In one embodiment, the plurality of first gas introduction holes 150 in communication with at least one first gas supply port 13c may be formed in the inner annular protrusion 142 of the exposed surface. In addition, in one embodiment, the plurality of second gas introduction holes 160 in communication with at least one first gas supply port 13c may be formed in the outer annular protrusion 144 of the exposed surface. Further, in one embodiment, the plurality of third gas introduction holes 170 in communication with at least one second gas supply port 14c may be formed outside the second gas introduction holes 160 of the exposed surface.

According to the present disclosure in some embodiments, it is possible to improve the uniformity of a plasma density distribution by partially changing the distribution of a gas introduced into a plasma processing chamber.

While certain embodiments have been described, these embodiments have been presented by way of example only, and are not intended to limit the scope of the disclosures. Indeed, the embodiments described herein may be embodied in various other forms. Further, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus, comprising:
a plasma processing chamber;
a substrate support disposed in the plasma processing chamber;
a lower electrode disposed in the substrate support;

at least one RF power supply coupled to the lower electrode; and
an upper electrode assembly disposed above the substrate support, wherein
the upper electrode assembly includes:
  a gas diffusion plate having at least one first gas supply port for a first gas and at least one second gas supply port for a second gas;
  an insulating plate; and
  an upper electrode plate arranged between the gas diffusion plate and the insulating plate, and having a plurality of first through holes in communication with the at least one first gas supply port and a plurality of second through holes in communication with the at least one second gas supply port,
the insulating plate includes an inner annular protrusion and an outer annular protrusion protruding downward from a lower surface of the insulating plate,
a part or an entirety of the outer annular protrusion overlaps with a substrate support surface of the substrate support in a plan view,
a width of the outer annular protrusion is greater than a width of the inner annular protrusion, and
the insulating plate has:
  a plurality of first gas introduction holes formed in the inner annular protrusion, each of the first gas introduction holes being in communication with the at least one first gas supply port through any of the plurality of first through holes,
  a plurality of second gas introduction holes formed in the outer annular protrusion, each of the second gas introduction holes being in communication with the at least one first gas supply port through any of the plurality of first through holes, and
  a plurality of third gas introduction holes formed outside the second gas introduction holes, each of the third gas introduction holes being in communication with the at least one second gas supply port through any of the plurality of second through holes.

2. The plasma processing apparatus of claim 1, wherein a protrusion dimension of the outer annular protrusion is greater than a protrusion dimension of the inner annular protrusion.

3. The plasma processing apparatus of claim 2, further comprising an electromagnet disposed on or above the plasma processing chamber.

4. The plasma processing apparatus of claim 3, wherein the insulating plate is made of quartz, and the upper electrode plate is made of aluminum.

5. The plasma processing apparatus of claim 4, wherein one or both of the inner annular protrusion and the outer annular protrusion have a rectangular shape in a cross-sectional view.

6. The plasma processing apparatus of claim 5, wherein one or both of the inner annular protrusion and the outer annular protrusion have a round shape with chamfered rectangular corners in a cross-sectional view.

7. The plasma processing apparatus of claim 4, wherein one or both of the inner annular protrusion and the outer annular protrusion have a semicircular shape.

8. The plasma processing apparatus of claim 1, wherein the plurality of third gas introduction holes are formed at an outer proximal end portion of the outer annular protrusion, and
the insulating plate further has a plurality of fourth gas introduction holes formed at an inner proximal end portion of the outer annular protrusion, each of the fourth gas introduction holes being in communication with the at least one first gas supply port through any of the plurality of first through holes.

9. The plasma processing apparatus of claim 1, wherein the plurality of third gas introduction holes are formed in the outer annular protrusion.

10. The plasma processing apparatus of claim 1, wherein the insulating plate further has an additional outer annular protrusion protruding downward from the lower surface of the insulating plate and surrounding the outer annular protrusion, and the plurality of third gas introduction holes are formed at an outer proximal end portion of the additional outer annular protrusion.

11. The plasma processing apparatus of claim 10, wherein a protrusion dimension of the additional outer annular protrusion is greater than a protrusion dimension of the outer annular protrusion.

12. The plasma processing apparatus of claim 1, wherein the insulating plate further has an additional outer annular protrusion protruding downward from the lower surface of the insulating plate and surrounding the outer annular protrusion, and the plurality of third gas introduction holes are formed in the additional outer annular protrusion.

13. The plasma processing apparatus of claim 1, wherein the plurality of first gas introduction holes is formed near an inner wall of the inner annular protrusion.

14. The plasma processing apparatus of claim 1, wherein a protrusion dimension of the outer annular protrusion is greater than a protrusion dimension of the inner annular protrusion.

15. A plasma processing apparatus, comprising:
a plasma processing chamber;
a substrate support disposed in the plasma processing chamber;
a lower electrode disposed in the substrate support;
at least one RF power supply coupled to the lower electrode; and
an upper electrode assembly disposed above the substrate support, wherein
the upper electrode assembly includes:
a gas diffusion plate having at least one first gas supply port for a first gas and at least one second gas supply port for a second gas;
an insulating plate; and
an upper electrode plate arranged between the gas diffusion plate and the insulating plate, and having a plurality of first through holes in communication with the at least one first gas supply port and a plurality of second through holes in communication with the at least one second gas supply port,
the insulating plate includes an inner annular protrusion and an outer annular protrusion protruding downward from a lower surface of the insulating plate,
the insulating plate has:
a plurality of first gas introduction holes formed in the inner annular protrusion, each of the first gas introduction holes being in communication with the at least one first gas supply port through any of the plurality of first through holes, a plurality of second gas introduction holes formed in the outer annular protrusion, each of the second gas introduction holes being in communication with the at least one first gas supply port through any of the plurality of first through holes, and a plurality of third gas introduction holes formed outside the second gas introduction holes, each of the third gas introduction holes being in communication with the at least one second gas supply port through any of the plurality of second through holes, the insulating plate further has an additional outer annular protrusion protruding downward from the lower surface of the insulating plate and surrounding the outer annular protrusion, the plurality of third gas introduction holes are formed at an outer proximal end portion of the additional outer annular protrusion, and a width of the additional outer annular protrusion is greater than a width of the outer annular protrusion.

16. A plasma processing apparatus, comprising:
a plasma processing chamber;
a substrate support disposed in the plasma processing chamber;
an upper electrode assembly disposed above the substrate support, and
a plasma generator configured to generate a plasma in a space between the substrate support and the upper electrode assembly, wherein
the upper electrode assembly has at least one first gas supply port for a first gas, at least one second gas supply port for a second gas, and an exposed surface exposed to the plasma,
the exposed surface has:
an inner annular protrusion and an outer annular protrusion protruding downward,
a plurality of first gas introduction holes formed in the inner annular protrusion, each of the first gas introduction holes being in communication with the at least one first gas supply port,
a plurality of second gas introduction holes formed in the outer annular protrusion, each of the second gas introduction holes being in communication with the at least one first gas supply port, and
a plurality of third gas introduction holes formed outside the second gas introduction holes, each of the third gas introduction holes being in communication with the at least one second gas supply port,
a part or an entirety of the outer annular protrusion overlaps with a substrate support surface of the substrate support in a plan view,
the plurality of first gas introduction holes are formed near an inner wall of the inner annular protrusion, and
a width of the outer annular protrusion is greater than a width of the inner annular protrusion.

* * * * *